United States Patent
Griffin

(10) Patent No.: US 10,324,625 B2
(45) Date of Patent: Jun. 18, 2019

(54) OPTIMIZATION OF MEMORY REFRESH RATES USING ESTIMATION OF DIE TEMPERATURE

(71) Applicant: Toshiba Memory Corporation, Minato-ku, Tokyo (JP)

(72) Inventor: Jason Griffin, Abingdon (GB)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/837,659

(22) Filed: Dec. 11, 2017

(65) Prior Publication Data

US 2018/0260121 A1    Sep. 13, 2018

Related U.S. Application Data

(63) Continuation of application No. 15/454,768, filed on Mar. 9, 2017, now Pat. No. 9,857,978.

(51) Int. Cl.
| | | |
|---|---|---|
| *G06F 3/06* | (2006.01) | |
| *G11C 11/406* | (2006.01) | |
| *G06F 13/10* | (2006.01) | |

(52) U.S. Cl.
CPC ......... *G06F 3/0604* (2013.01); *G06F 3/0619* (2013.01); *G06F 3/0653* (2013.01); *G06F 3/0659* (2013.01); *G06F 3/0673* (2013.01); *G11C 11/40611* (2013.01); *G11C 11/40626* (2013.01); *G06F 13/107* (2013.01); *Y02D 10/14* (2018.01)

(58) Field of Classification Search
CPC ..... G06F 3/0604; G06F 3/0619; G06F 3/0653
USPC ............................ 365/211, 212, 233.13, 149
See application file for complete search history.

(56) References Cited

U.S. PATENT DOCUMENTS

| | | |
|---|---|---|
| 5,278,796 A | 1/1994 | Tillinghast et al. |
| 6,507,530 B1 | 1/2003 | Williams et al. |
| 6,603,697 B2 | 8/2003 | Janzen |
| 7,027,343 B2 | 4/2006 | Sinha et al. |
| 7,035,155 B2 | 4/2006 | Stimak et al. |
| 7,177,220 B2 | 2/2007 | Chou et al. |
| 7,206,244 B2 | 4/2007 | Cruz et al. |
| 7,305,518 B2 | 12/2007 | Zeighami et al. |
| 7,318,130 B2 | 1/2008 | Morrow et al. |
| 7,340,618 B2 | 3/2008 | Kark et al. |
| 7,688,666 B2 | 3/2010 | Choi et al. |
| 8,848,471 B2 | 9/2014 | Franceschini et al. |

(Continued)

FOREIGN PATENT DOCUMENTS

JP    2014-182854 A    9/2014

*Primary Examiner* — Han Yang
(74) *Attorney, Agent, or Firm* — White & Case LLP

(57) ABSTRACT

A memory system includes a memory in which stored data is periodically rewritten by a refresh command, and a memory controller. The memory has an input/output ("I/O") terminal, and the memory controller is communicatively coupled by a channel to the I/O terminal. The memory transmits a plurality of commands over the channel to the memory. The memory controller estimates a first total energy consumed based on the plurality of commands during a first sampling period, determines a temperature of the memory based on the first total energy consumed in the first sampling period, determines a first refresh cycle rate corresponding to the first temperature of the memory and transmits a refresh command to the memory based on the first refresh cycle rate.

20 Claims, 6 Drawing Sheets

(56) References Cited

U.S. PATENT DOCUMENTS

| | | | |
|---|---|---|---|
| 9,001,608 B1 | 4/2015 | Chishti et al. | |
| 9,087,612 B2 | 7/2015 | Franceschini et al. | |
| 9,323,304 B2 | 4/2016 | Salessi et al. | |
| 9,396,065 B2 | 7/2016 | Webb et al. | |
| 9,529,673 B2 | 12/2016 | Romanovskyy | |
| 2006/0236027 A1 | 10/2006 | Jain et al. | |
| 2008/0028137 A1 | 1/2008 | Schakel et al. | |
| 2011/0205826 A1* | 8/2011 | Kuroda | G11C 11/406 365/222 |
| 2013/0132661 A1 | 5/2013 | Schakel et al. | |
| 2013/0279283 A1 | 10/2013 | Seo et al. | |
| 2014/0189229 A1 | 7/2014 | Schoenborn et al. | |
| 2015/0085594 A1 | 3/2015 | Dong et al. | |
| 2016/0048451 A1 | 2/2016 | Solihin | |
| 2016/0064063 A1* | 3/2016 | Nomura | G11C 11/40618 365/51 |
| 2016/0086654 A1 | 3/2016 | Arora et al. | |
| 2016/0239442 A1 | 8/2016 | Chun et al. | |

\* cited by examiner

OPTIMIZATION OF MEMORY REFRESH RATES USING ESTIMATION OF DIE TEMPERATURE

CROSS-REFERENCE TO RELATED APPLICATION

This application is a continuation of application Ser. No. 15/454,768, filed Mar. 9, 2017, the entire contents of which are incorporated herein by reference.

FIELD OF THE INVENTION

The present invention generally relates to systems and methods to adjust refresh cycle frequency using estimations of memory die temperature.

BACKGROUND OF THE INVENTION

Many modern electronic systems employ a volatile memory for temporary storage, caching and buffering, such as a DRAM arranged as a plurality of memory dies organized into banks of devices which process commands. The dies are coupled to a memory controller by a bi-directional memory bus. The memory bus directs commands from a memory controller to the various dies, and directs data from the dies to the memory controller.

Data is stored on DRAMs as a memory cell charge. Over time, the memory cell charge may "leak" or dissipate, causing increased occurrence of memory errors in the data stored on the DRAM. In order to prevent data loss and minimize memory errors, refresh commands need to be issued periodically at a set rate to refresh the charges storing data in the die. Memory cell charge leakage is particularly linked to increased temperatures of the memory die, and gets worse as the temperature rises. The refresh rate must be higher when the die is operating at a high temperature in order to prevent occurrence of memory errors.

In typical systems, the refresh rate needs to increase when the temperature exceeds a set threshold, in many cases a first threshold is set to 85° C. For example, refresh commands are set to occur at a first average rate at temperatures up to 85° C. degrees, and are set to double to a second average rate at temperatures from 85° C. degrees to 95° C. degrees. Adjusting the refresh command rates at a specified threshold temperature requires that the refresh rate within the range of temperatures up to that threshold accommodates the maximum temperature in the range. For example, the refresh rate for all temperatures below 85° C. must be high enough to minimize data loss at or near 85° C., resulting in far more refresh cycles at low temperatures, such as room temperature or 60° C., than is necessary. As refresh cycles consume power and occupy the memory bus during execution, this overuse of unnecessary refresh cycles at low temperatures is inefficient.

Memory devices do not provide any sensor or other means of directly measuring the temperature of the memory die. In the absence of such a direct measurement, there is a need for a method of accurate measurement of the memory die temperature by alternative means. Methods which do not require the modification of the memory device are obviously advantageous as they do not require redesign of a memory device and so may work with any existing or future memory device.

Accordingly, there is a long-felt need to correct the problems inherent to present day systems.

BRIEF DESCRIPTION OF THE INVENTION

In an aspect, a memory system includes a memory that has an input/output ("I/O") terminal and a memory controller coupled by a channel to the I/O terminal. The memory controller is able to transmit a first plurality of commands over the channel to the memory. Data is periodically rewritten to the memory by a refresh command. The memory controller estimates a first total energy consumed based on the first plurality of commands during a first sampling period, determines a first temperature of the memory based on the first total energy consumed in the first sampling period, determines a first refresh cycle rate corresponding to the first temperature of the memory, and transmits a refresh command to the memory according to the first refresh cycle.

In another aspect, a method of determining refresh rates includes recording, at a memory controller, a tally of commands transmitted to a memory within a sampling period, receiving a signal that the sampling period is complete, determining a total energy consumed associated with the transmitted commands in the tally, estimating a temperature of the memory device based on the total energy consumed, determining a refresh rate corresponding to the temperature of the memory device, and transmitting a refresh command to a memory device based on the refresh rate.

DETAILED DESCRIPTION OF THE INVENTION

Figure 1:
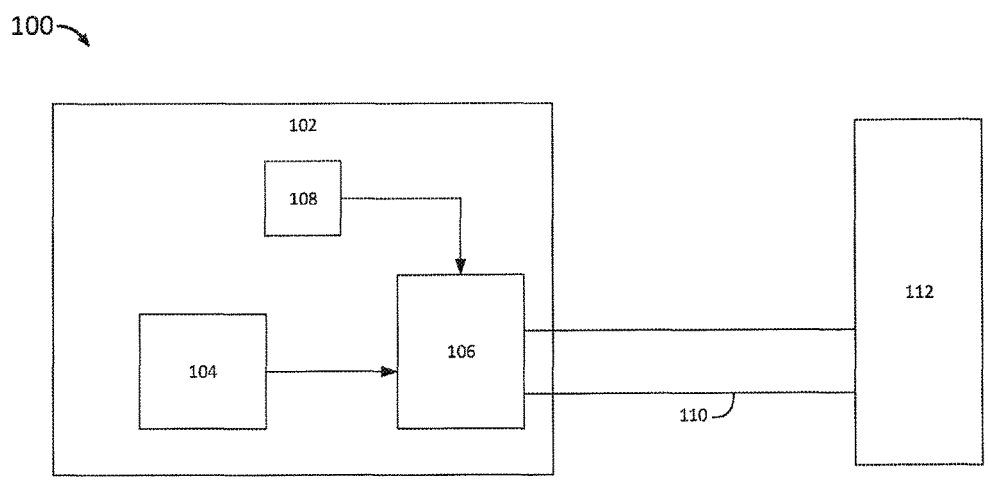
FIG. 1 shows a block diagram of a memory device including a controller, according to an embodiment.

FIG. 1 shows a block diagram of a memory device system 100 including a controller 106 coupled to a memory device 112. An application-specific integrated circuit (ASIC) 102 includes a central processing unit (CPU) 104, a memory controller 106, and an ambient temperature sensor 108. The memory controller 106 is coupled to the memory device 112 by a memory bus 110.

The memory controller 106 is part of an ASIC 102 which provides access from a CPU 104 or other entity on the ASIC 102 to an external memory device 112. The external memory device may be DRAM or any other high speed memory technology. The memory controller 106 is attached to the memory device 112 over a high speed bus 110. The ASIC 102 has a means to measure the ambient temperature Tmc via a temperature sensor 108. The ambient temperature on the ASIC 102 is approximately the same for all devices in the proximity of the chip. The memory device 112 operates at a temperature Tme. The temperature Tme, and the temperature Tmc, is changed by the processing of commands at the memory device 112 and the controller 106, respectively.

The CPU 104 or other entity issues commands to the controller 106, such as read and write commands. The controller 106 sends data to the memory device 112 from the CPU 104 or other entity and receives data from the memory device 112 to the CPU 104. The controller 106 sends the data to the memory device 112 over the memory bus 110.

For clarity, a single memory device 112 is shown attached to the ASIC 102 by the memory bus 110. However, multiple memory devices may be coupled to the ASIC 102 on the same memory bus 110. Each of the multiple memory devices may have a different bus track length to the controller 106. Further, each of the multiple memory devices may have a different associated temperature (for example, Tme 1, 2, 3 etc.). Where the memory device temperature change is tracked, this will be on a per-rank basis.

As a die processes a set of commands, the die temperature changes according to whether the heat generated in processing the commands is greater or less than the die's capability to dissipate heat. If the heat generated exceeds the heat dissipated, the temperature will rise; if the heat dissipated exceeds the heat generated, the temperature will fall. Each command has an associated amount of heat generated by the memory die and the die will have a certain amount of heat dissipation determined by its packing within the memory device.

Data is stored on the memory device as a memory cell charge. Over time, and in particular in response to changes in temperature of the memory device, memory cell charge leakage can occur leading to memory errors. In order to prevent data loss, a memory refresh system is used internally to the memory device in which the data is periodically read and rewritten to the same area of the memory die in response to a refresh command to preserve the memory cell charge containing the information. Refreshes occur approximately periodically (at an average rate over time), and the rate at which the refresh occurs is determined at least in part on an actual operating temperature of the memory die.

Figure 2:
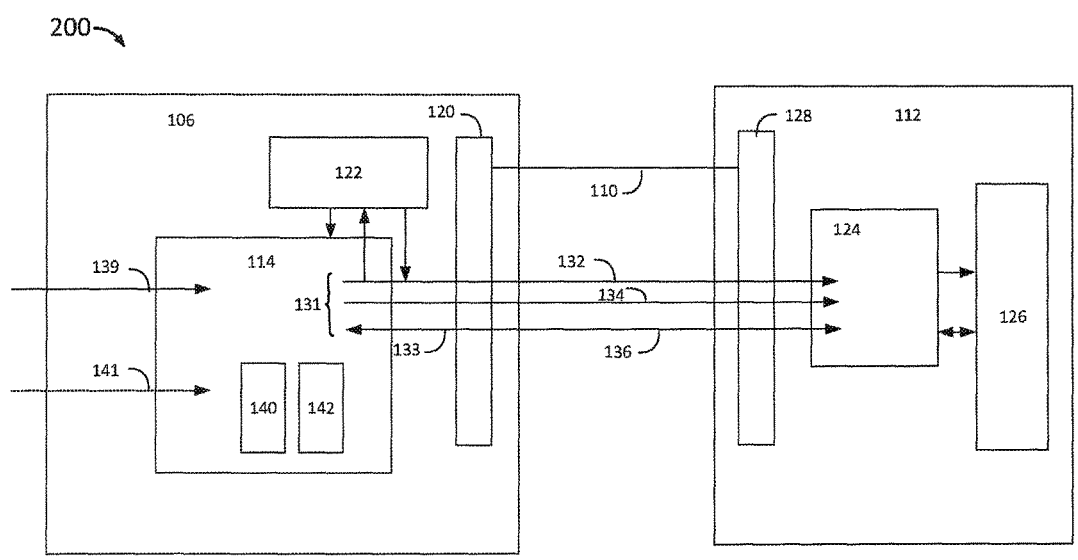
FIG. 2 shows a detailed enlargement of the memory controller and memory device of FIG. 1; according to an embodiment.

FIG. 2 shows a detailed enlargement of the memory controller 106 and memory device die 112 of FIG. 1. The memory controller 106 includes a command parser engine 114, an I/O driver 120 for the memory bus 110, and a memory device command tally engine 122. The memory device die 112 includes an I/O driver 128 for the memory bus 110, a memory cell array controller 124, and memory cell array 126. These components reside on a memory die within the memory device and there may be multiple dies within a single memory device, although for clarity only the components of one die are shown, which will be referred to as memory device die 112.

The memory bus 110 is a bi-directional bus connected to the memory device die 112 at an I/O terminal. At the memory controller 106 output drivers 131 are connected to the lines of the memory bus 110 to output data to the memory device die 112. The output drivers 131 include a driver to output an address and commands to the memory device die 112. For example, bus line 132 outputs memory commands to the memory device die 112, and bus line 134 outputs an address to the memory device die 112. Input receivers 133 are connected to the bus lines of the memory bus 110 to receive data from the memory device die 112. For example, data is received at the memory controller 106 over bus line 136.

Similarly, the memory device die 112 has an I/O driver 128 which includes receivers to receive the commands, addresses, and data from the memory controller 106 and to output data back to the controller 106 (for example, output data over bus line 136 to the memory controller 106). The high speed memory bus 110 behaves like a transmission line.

The memory controller 106 periodically transmits a refresh command as background maintenance of the memory device die 112. Since the memory controller 106 has no means to directly measure the temperature of the memory device die 112, the refresh command cycle rate is determined based on an estimate of the temperature of the die(s) in the memory device 112. To limit inefficiency in the refresh command cycle rates, the refresh cycle rate is determined based on an estimate of the actual temperature of the memory device die 112, and the rate at which memory cell charge leakage occurs at the given temperature. If the refresh cycle rate is poorly matched to the temperature, more refresh commands may be transmitted than are necessary, consuming power and bandwidth.

It is therefore advantageous to minimize the refresh commands which are executed to those necessary for maintaining data integrity at the current operating temperature of the memory die, to conserve power and bandwidth. It is also advantageous for a memory controller to be able to accurately estimate the temperature of the individual memory dies in a memory device, since memory devices do not generally provide any means to provide a controller with temperature measurements of its dies directly.

After a memory refresh cycle rate is determined, the refresh command is performed approximately periodically according to the rate. The controller 106 may include a timer 140 which is used to indicate that a refresh command should be transmitted to the memory device based on the current memory refresh cycle rate. The timer 140 indicates that the designated period has elapsed, and the command parser 114 transmits a refresh command to the memory device die 112.

The command parser also includes a memory 142 which contains information regarding the memory refresh cycle rate appropriate for a temperature or temperature range of the memory device die 112. The memory refresh cycle rate is proportional to an actual temperature of the memory device die 112. Where a memory device has multiple dies, there may be a different memory refresh cycle rate for each individual die within the device according to the temperature of each die. The memory 142 may store the optimal (or minimum) refresh cycle rate at different temperatures as a look-up table. The information in the look-up table may be programmable or may contain information from a manufacturer's specification for the DRAM. The look-up table may include ranges of temperatures for which a particular memory refresh cycle rate is appropriate in which the ranges have greater granularity than the typical 85° C. threshold. In some embodiments, the look-up table may include a list containing an appropriate memory refresh cycle rate for each temperature in the operating range of the memory device die 112. Alternatively, in some embodiments, the memory 142 may include logic to calculate an appropriate memory refresh cycle rate based on an input temperature. In some embodiments, the memory refresh cycle rate for temperatures nearing 85° C. may be significantly increased, such that near 85° C. the memory refresh cycle rate is nearly double the memory refresh cycle rate for temperatures which are significantly below 85° C., for example 60° C.

An ambient temperature reading from the sensor 108 (shown in FIG. 1) is input to the command parser 114. In some implementations, the ambient temperature reading is accounted for in a determination of the estimated actual temperature of the die(s) in the memory device 112 and also as a means to determine the rate of heat dissipation which may impact the memory device die 112. In some implementations, at a start-up of the memory device die 112 the ambient temperature reading is used as the initial temperature of the die(s) in the memory device 112.

Since the memory refresh cycle rate should be chosen based on the current temperature of the memory device die 112, the temperature of the memory device die 112 must be checked periodically. Periodically checking that the appropriate memory refresh cycle is being implemented for the current temperature prevents unnecessary refreshes at low temperature saving power and bandwidth, and also protects the data in the memory device die 112 from memory errors as the temperature increases. The temperature of the memory device die 112 is estimated over each sampling period which may include multiple cycles or a specific length of time.

Simple thresholds sometimes employed in memory device dies 112 (such as a threshold at 85° C.) are not granular or accurate enough to prevent over-use of the refresh command because the memory refresh cycle rate is determined for a maximum temperature in the threshold (a worst-case-scenario refresh cycle rate). Further, the temperature of the portion of the memory device that comprises the die provides the most accurate temperature of the memory device die 112, though a temperature sensor of the ASIC (sensor 108 shown in FIG. 1) may provide an indication of the CPU (core) temperature or the ambient temperature.

Therefore, to estimate the temperature of the portion or area of the memory device die 112, the power or heating effect of the commands sent to the memory cell array controller 124 is calculated by tallying the commands sent by the memory controller 106 to the memory device die 112 over a sampling period. The commands sent from the CPU 104 or other entity to the controller 106 are tallied in the memory device command tally engine 122. For each command executed within a sampling period, the current consumed and the time period of the command are integrated (approximated by average or peak/burst current multiplied by the command period time) and tallied to estimate the energy input which will be directly proportional to the temperature change, delta Tme, at the memory device die 112. As the memory refresh cycle rate depends on the actual temperature of the memory device die 112, the delta Tme may be either positive (if the energy input exceeds any heat dissipation factors) or negative (if the heat dissipation factors exceed the energy input).

At start-up of the memory device die 112, the initial temperature of the memory device die 112 is the ambient temperature detected by sensor 108. The temperature change determined by the memory device command tally engine die 122 is input to the command parser 114, where the command parser 114 combines the determined temperature change from the memory device command tally engine 122 with the ambient temperature reading to determine a temperature of the memory device die 112, after start-up of the memory device die 112. The command parser 114 then accesses the memory 142 to determine an appropriate memory refresh cycle rate for the current temperature of the memory device die 112. The command parser 114 transmits a refresh command to the memory device and sets the timer 140 for the current memory refresh cycle rate. The command parser 114 also stores the current determined temperature in a memory.

After start-up, the calculated temperature rise by which the temperature of the memory device die 112 has changed in the sampling period can be combined with the previous temperature recorded during the previous sampling period in order to determine the new current temperature at the memory device die 112. The temperature of the die calculated by this method is an estimate of the actual temperature at the memory device die 112 and the memory refresh cycle rate can be determined based on this temperature in order to provide appropriate refreshing of the data to prevent memory errors.

The current consumed by each of the commands may be determined from manufacturer specifications. Although the consumed current recorded in a manufacturer specification is typically representative of a maximum (peak/burst) current during the processing of a command, this value gives a reasonable approximation of an upper limit of the energy consumed during the period of processing of a command by DRAM. In some implementations, if a more precise estimate of the consumed current is available, for example as a profile of current over time, the more precise current estimate may be used.

Similarly, a time period over which the command is processed may be determined from manufacturer specifications. By multiplying the time period of the command and a current consumed by the memory device die 112 during processing, a power consumption or energy input, or total energy consumed, may be calculated. The energy input is directly proportional to the temperature change of the device (delta Tme).

The temperature change may be further refined to account for heat dissipation during processing of commands and also during idle periods of the memory device (or power down or self-refresh periods). If no commands are sent, the memory device die 112 is idle and will tend towards an idle state temperature which in the limit will be the ambient temperature.

Once a temperature change, delta Tme, for the sampling period is determined, the delta Tme is combined with the previously determined and stored temperature of the memory device die 112. At an initial start-up of the device the temperature is read from the ambient temperature provided by the sensor 108. The sum of the temperature change, delta Tme, and the previously recorded temperature of the memory device die 112 represents the new temperature of the memory device die 112 as a result of the commands executed in the sampling period and accounting for heat dissipation during the same period. Following the determination of the refresh cycle rate (1) the temperature of the memory device die 112 is stored as the new temperature for use in determining the temperature in the next sampling period, (2) the memory refresh cycle rate are updated according to the information in memory 142 and refresh commands are transmitted, (3) the timer 140 is updated to reflect any change in the memory refresh cycle rate, and (4) a new sampling period begins.

The power consumed by individual DRAM commands within a sampling period is tallied at the first memory device command tally engine 122. There are five basic DRAM commands, including Activate (ACT), Precharge (PRE), Read (RD), Write (WR), and Refresh (REF).

In the ACT command, an entire row of data is read from the memory cell array 126 and stored in the row buffer. In PRE, the contents of the row buffer are written into the memory cell array 126. In RD, the row buffer contents are read and output to the I/O lines of the memory device die 112. In WR, the data on the I/O lines is written into the row buffer.

The ACT command occurs over a period of time tRAS (Row Access Strobe) which is specified and published by the DRAM manufacturer. The PRE command occurs over a period of time tRC (Row Cycle Time)—tRAS. Typical values might be 32 ns for tRAS, 46 ns for tRC. The REF cycle lasts for tRFC, which may typically be any of 160, 260, 350 or 550 ns, depending on the DRAM die capacity (for DDR4 2 Gb, 4 Gb, 8 Gb, or 16 Gb, as an example).

A current consumed by the ACT and PRE commands is Idd0. A typical value for Idd0 is 60 mA. The power consumed by an ACT command is therefore proportional to 60×32=1920. The power consumed by a PRE command is proportional to 60*(46−32)=840.

A burst (peak) current consumed by the WR command is Idd4w, a typical value of Idd4w being 150 mA. The WR command typically takes 4 clock cycles, or for a typical clock cycle time of 1 ns, the WR command takes 4 ns to complete. The power consumed by a WR command is therefore proportional to 150*4=600.

Idd4r is the burst (peak) current consumed by execution of the RD command. A typical value of Idd4r is 130 mA. The RD command typically takes 4 clock cycles, or for a typical clock cycle time of 1 ns, the RD command requires 4 ns to complete. The power consumed by a RD command is therefore proportional to 130*4=520.

Idd5 is the burst (peak) current required to execute the REF command, and is typically about 170 mA. The maximum power consumed by the REF command in refreshing a die is proportional to 170*550=93,500.

Similar calculations may be used for less frequently issued commands, such as ZQC (the ZQ Calibration, for re-calibrating the I/O driver termination impedance values). The idle state may be approximated by assuming a minimal power proportional to an I*t value of 1, as an example.

Calculating the power consumption of each of the commands enables a tally of the total power consumed to be kept during the sampling period, the total power consumed being proportional to the temperature change of the die. At the end of the sampling period, any dissipation of temperature is accounted for, and an estimate of the actual temperature is determined based on the previously stored temperature of the memory device die 112. The memory 142 determines if the new temperature of the memory device die 112 requires a change in memory refresh cycle rate.

Adjusting the memory refresh cycle rate according to the die temperature minimizes the error rates on the memory device die 112 and also reduces the power used by refresh commands as the bandwidth consumed by these commands can be reduced at lower temperatures. Refresh command cycle rates can be reduced at lower temperatures and the rates can be changed according to a more nuanced determination of the temperature such that the rate better matches the refresh requirements of the device. Power is conserved because unnecessary commands at low temperatures are eliminated and memory errors are minimized, because the refresh cycle rates are not based on the maximum temperature within a set range but rather on the actual temperature of the memory device die 112.

Figure 3:
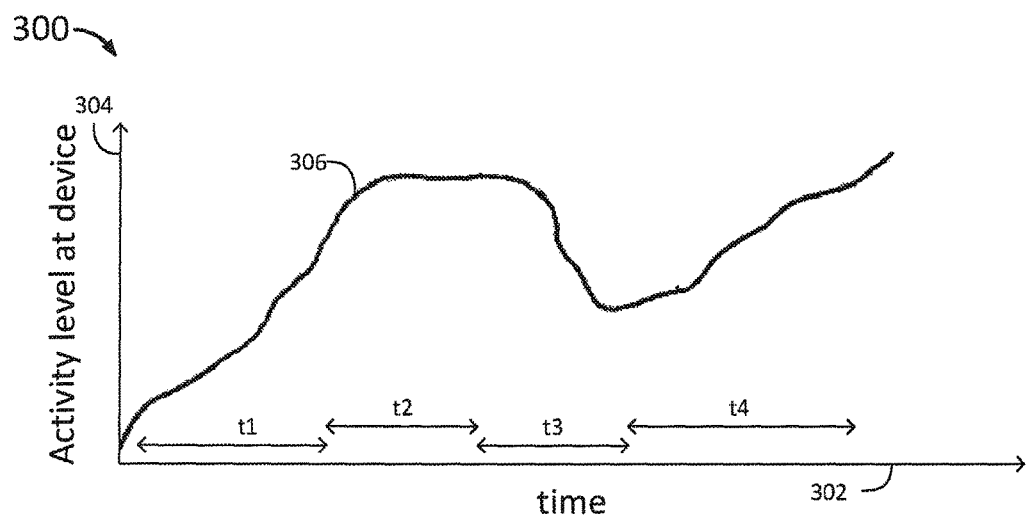
FIG. 3 shows a plot of the activity level at a memory die, according to an embodiment.

FIG. 3 shows a plot 300 of the activity level at a memory die, such as the memory device die 112 of FIGS. 1 and 2. The plot 300 includes an x-axis 302 representing time and a y-axis 304 representing an activity level of the device. The activity level of the device over time is represented by the trace 306. The activity level of the device 306 may include the tallied power consumed by the device in executing commands within a sampling period or number of sampling periods.

The plot 300 shows a notional measure of the activity level (or traffic) over time at a memory device. The activity level is proportional to the temperature of the memory device. The activity level is also proportional to the temperature of the surrounding die to an extent. The activity level measured during a sampling period is proportional to a temperature change of the memory device.

The plot 300 shows a first period t1 of increasing activity level, followed by a period t2 of generally stable activity level. This is followed by a third period t3 of decreasing activity level at the memory device, and finally a fourth period t4 of increasing activity level.

The change in the activity level during a sampling period is proportional to the change in temperature of the die. The temperature of the memory device can be calculated based on the activity level at the memory device tallied during a sample period added to the previously recorded temperature of the die. In some cases a heat dissipation factor may be accounted for in the tallied activity level or in the temperature calculation.

Figure 4:
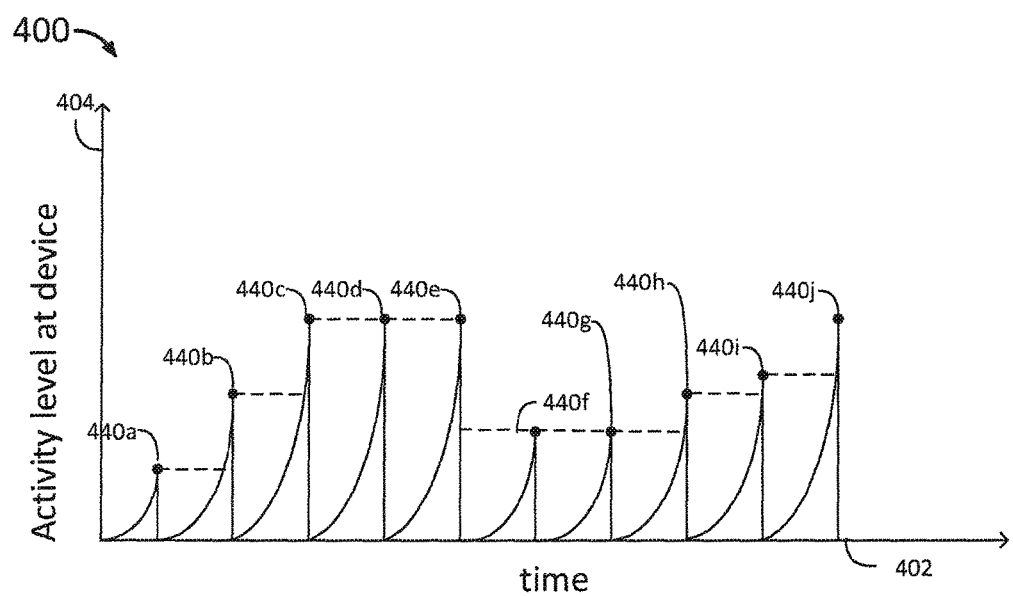
FIG. 4 shows a plot of the changes in activity level at a memory die over a series of sampling periods, according to an embodiment.

FIG. 4 shows a plot of the activity level at a memory die corresponding to a change in temperature of the die and illustrating the process of tallying an activity level for each sampling period. The plot 400 includes an x-axis 402 representing time, and a y-axis 404 representing an activity level of the device corresponding to a temperature change. The activity level is a measure of the value being accumulated in the accumulator (such as memory device command tally engine 122 in FIG. 1) on the memory controller. The activity level of the device as tallied at the end of each sampling period, and is illustrated by the vertical lines 440 a-j.

The vertical lines 440 a-j are equally spaced in fixed sampling periods. The weighted contributions (WC) from commands and from periods in which the device is idle are added to the current value of the accumulator every sampling period, and a heat dissipation value is subtracted every cycle of the sampling period.

As the memory refresh cycle rate corresponds to the temperature of the device, each of the commands executed by the memory device adds to a temperature rise of the memory device. If the commands executed during a sampling period correspond to an energy input that exceeds the heat dissipation from the memory device, the temperature of the memory device rises. A rise in temperature of the memory device may occur even if the activity level at the memory device is constant, from one sampling period to the next.

The plot 400 generally follows the same activity level changes as in plot 300 of FIG. 3. The measured activity level tallies measured in a first time period t1 are increasing, such that, for example, vertical line 440b is higher than vertical line 440a immediately preceding it. There are very small or no changes in activity level between 440c, 440d, and 440e. From the sampling period illustrated by vertical line 440e there is a sharp decrease in activity level for the subsequent sampling period 440f. After 440g the activity level rises again.

The activity level is proportional to a temperature change of the controller or the die. Over the course of a sample period the trend of the activity level will be up and to the right if commands are issued to the memory device at a rate that provides an energy accumulation greater than the heat dissipation. Using the determined activity level, proportional to the temperature change of the die, in determining whether to update the memory refresh cycle rate for the memory device die 112 is an efficient use of power. The memory refresh cycle rate is closely matched to the demands of the memory device, and unnecessary refresh cycles are avoided.

Figure 5:
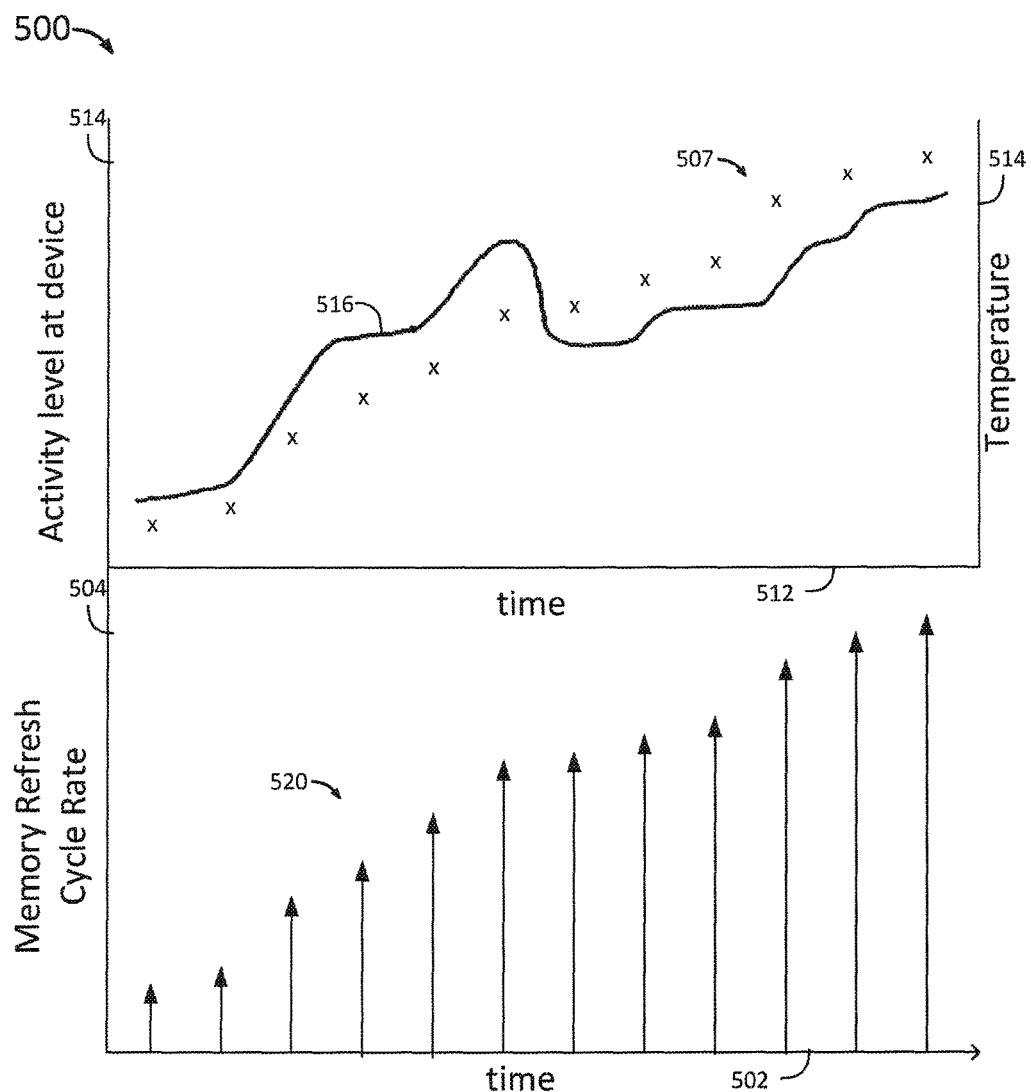
FIG. 5 shows a plot of activity level at a memory die, the determined temperature of a memory die, and the associated refresh cycle rate, according to an embodiment.

FIG. 5 shows a plot 500 of activity values corresponding to temperature for a memory die stored in the accumulator over several sampling periods and the corresponding memory refresh cycle rates. The plot 500 shows the process over a longer period of time than in FIGS. 3 and 4.

The plot 500 includes a first x-axis 502 representing time and a first y-axis 504 representing memory refresh cycle rate. On the first x-axis 502, vertical arrows 520 indicate a determined memory refresh cycle rate at the end of each sampling period. The plot 500 also includes a second x-axis 512 representing time, a second y-axis 514 representing an activity level of a memory device on which a trace 516 of the activity level over several sampling periods is depicted, and a third y-axis 515 representing temperature. The temperature indicated by the x-marks 507 correspond to a temperature of the memory device based on the activity level during a sampling period.

The temperature is determined based on the activity level during the sampling period and a previously calculated temperature of the memory device. Based on the calculated temperature (shown as x-marks 507) at the end of each sampling period, a memory refresh cycle rate is determined (shown as vertical arrows). The arrows 520 indicate the memory refresh cycle rate determined for the memory device in response to the temperature of the memory device (shown as x-marks 507) determined from the activity levels of the memory device (shown in trace 516).

According to the memory refresh cycle rate, refresh commands are issued periodically. The refresh cycles continue at the given memory refresh cycle rate until a new rate is determined based on the temperature of the memory device.

The memory refresh cycle rate may be determined from a look-up table stored in a memory. The memory refresh cycle rate may increase linearly with the temperature of the memory device, or may increase according to any other system.

Plot 500 shows that when the activity level at the memory device increases, the temperature of the memory device typically increases as well, resulting in increased determined memory refresh cycle rates. Even if the activity level at the memory device does not increase, continued activity can increase the temperature of the memory device beyond a current device temperature. For example, between the first two sampling periods, the activity level at the device increases only slightly. However, the temperature of the memory device increases from the first to the second sampling period and there is a corresponding increase in the memory refresh cycle rate determined for the memory device corresponding to the increase in memory device temperature. The memory refresh cycle rates are adjusted to match the temperature of the memory device and reflect the need to refresh data to minimize memory errors at a given temperature of the memory device. Adjusting the memory refresh cycle rates based on the current temperature of the memory device allows a more efficient use of refreshes, so that refreshes occur more often at high temperatures and less often at low temperatures, which conserves power and bandwidth.

Figure 6:
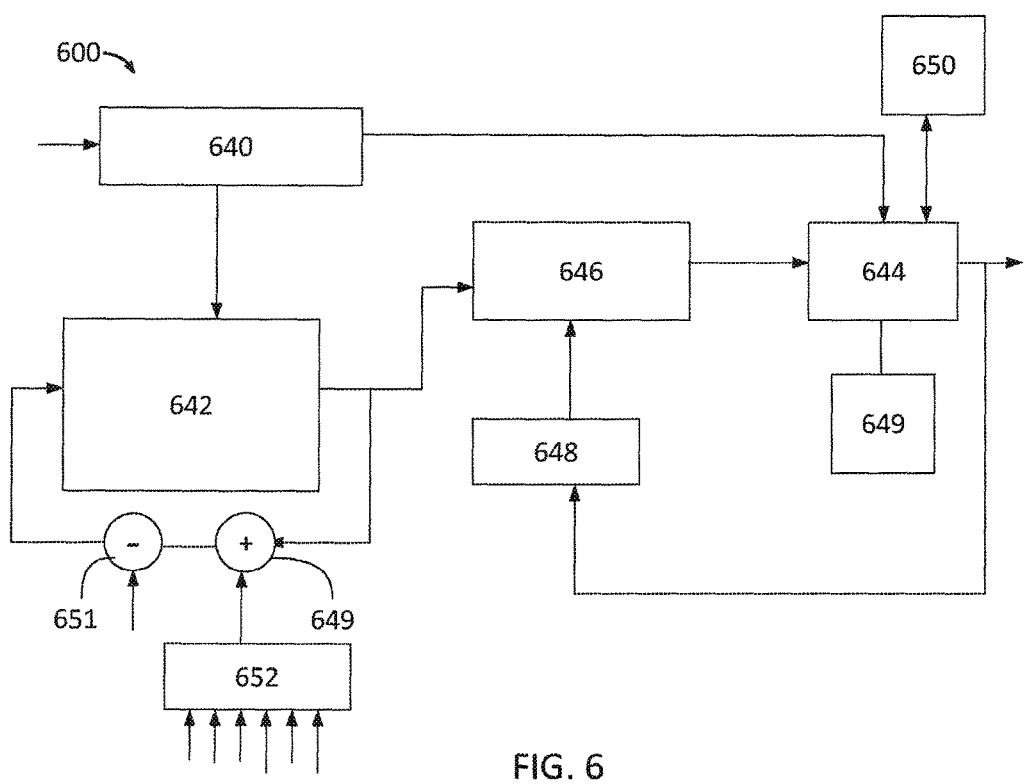
FIG. 6 shows a block diagram of the usage of an accumulator in a system, according to an embodiment.

FIG. 6 shows a block diagram 600 of the usage of an accumulator 642 in a system. The block diagram 600 includes a programmable timer or counter 640 set to the sampling period as either a length of time or a number of commands to be executed. The timer 640 signals the accumulator 642 when the time period or number of cycles is complete for a sampling period. The accumulator 642 tallies the commands 652 which are executed in the sampling period and determines a power consumed for each command by multiplying the programmed current by a time to execute the command. By summing the weighted contribution for each command in the cycle 649 and subtracting a heat dissipation factor 651, the accumulator 642 determines an energy consumption over the sampling period which is proportional to the temperature change during the period.

The temperature change during the period is added 646 to a previously recorded and stored temperature 648 determined during a prior sampling period, to determine the current temperature of the memory device. The current temperature of the memory device is then provided to a memory 644 equipped with a look-up table 649 to determine an appropriate memory refresh cycle rate for the given temperature. Once the appropriate refresh cycle rate is determined, a timer 650 is set based on the current memory refresh cycle rate to indicate when the next background refresh command should be transmitted. The current temperature of the memory device is stored in the memory 648 for use in the determination of the temperature of the memory device in the next sample period.

The contribution per cycle of a particular type of command can be used in the accumulators determination of an activity level or power usage over a sampling period. Alternatively, a weighted contribution in a single cycle can be used at the point the command is issued. The current usage from a command can be determined with the weighted contribution by calculating the contribution multiplied by a command time. At the end of the command time, the net effect of using a contribution over the cycle or a weighted contribution are the same, but the implementation differs slightly. For example, for the REF command IDD(REF) is accumulated for as many cycles (nRFC) that cover the refresh time (tRFC), or IDD(REF)*nRFC is applied at the point the refresh command is issued with the knowledge that no other command will be issued for at least tRFC while the bus is occupied. Idle periods or periods of power down or self-refresh are applied for every cycle that they last, because there is no command time for execution associated with these commands and they are variable length of execution. A heat dissipation value or factor is subtracted every cycle to accommodate for heat dissipation during the sampling period. The heat dissipation value is programmable.

In this way, the memory refresh cycle rates are adjusted based on the estimated temperature of the memory device. Memory refreshes can then be transmitted only as often as is necessary for a given temperature of the memory device, and power and bandwidth are conserved compared to systems which operate at a single memory refresh cycle rate within a temperature range.

Figure 7:
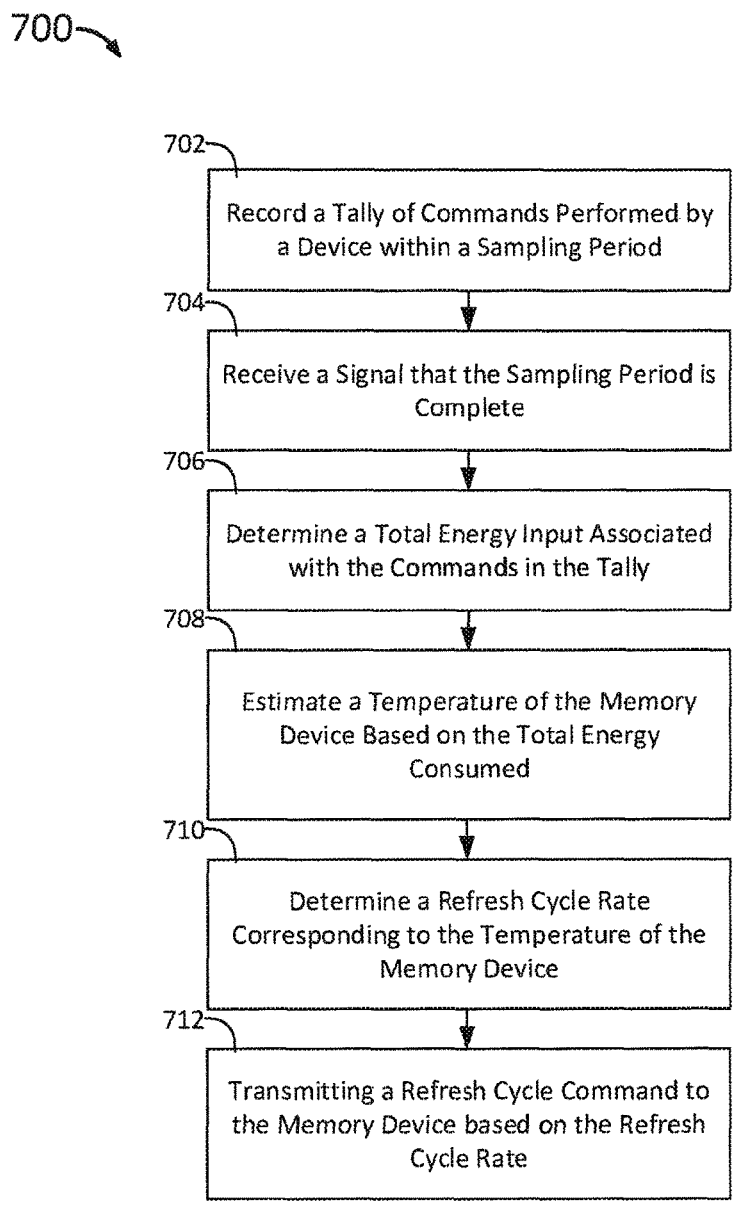
FIG. 7 shows a flow chart for the adjustment of the refresh cycle rate for a memory die, according to an embodiment.

FIG. 7 shows a decision chart 700 for the adjustment of the refresh cycle rate for a memory die based on a temperature estimation of the memory die.

At step 702 the accumulator in a controller records a tally of commands executed by a device in a sampling period. The tally may include a record of the number of each type of command executed by the memory device. The tally is accumulated on a per-rank basis.

At step 704 the accumulator receives a signal that the sampling period is complete. The sampling period may be measured as a programmable period of time or number of commands to be executed. Once the sampling period is complete, at step 706 the accumulator determines a total energy input associated with the executed commands in the tally. This may be determined by multiplying a known average (or peak) current for a particular command by the time in which the command is executed. Both the average (or peak) current for commands of different types and the time for the command to be executed may be programmed and may be found in a manufacturing specification for the device. The average current and the time for execution of the command give an estimated energy input value or power consumed during the execution of the command. This is proportional to the temperature change in the device due to the execution of the command.

At step 708, an estimate of the temperature of the memory device is determined based on the total energy consumed. The total energy consumed over the sampling period is proportional to the temperature change of the memory die as a result of executing the commands. A heat dissipation factor can be included in the calculation of the temperature change, as can an ambient temperature change measured by a temperature sensor at a memory controller which accounts for external heating factors. The temperature change, whether positive (if the energy input of the commands during the sampling period exceed the heat dissipation factor) or negative (if the heat dissipation factor exceeds the energy input of the commands), can be added to a stored previous temperature of the memory device. At a start-up condition, the ambient temperature can be used as the stored previous temperature of the memory device. The temperature change caused by the execution of commands is added to the stored previous temperature (the last calculated temperature in the previous sampling period, or the ambient temperature at start-up), causing an increase in the determined temperature of the memory device.

At step 710, the memory controller determines a refresh cycle rate that corresponds to the determined temperature of the memory device. The memory controller may determine the refresh cycle rate by accessing a look-up table, or by providing the current temperature to logic in the memory controller which calculates the appropriate refresh cycle rate. The refresh cycle rate is scaled with the temperature so as to provide an appropriate number of refresh commands to the memory device without transmitting unnecessary refresh commands at low temperatures.

At step 712, the memory controller transmits a refresh cycle command to the memory device based on the refresh cycle rate. Adjusting the refresh cycle rate based on the temperature of the memory die conserves power by making the refresh cycle rate more closely match the needs of the memory device at a given temperature.

By using an average current and time for execution to determine an energy input of commands executed by the device within a sampling period, the temperature of the memory device can be accurately determined and the memory refresh cycle rate can be adjusted to suit the determined temperature of the device. Adjusting the memory refresh cycle rate based on the estimated actual temperature of the memory device allows a more nuanced memory refresh of the device and eliminates unnecessary refresh cycles at low temperatures while still protecting the data integrity on the device. The determination of the temperature based on the energy consumed accurately determines a temperature of the die, and adjustment of the memory refresh cycle rate based on this determination allows for more power efficient refreshing.

Other objects, advantages and embodiments of the various aspects of the present invention will be apparent to those who are skilled in the field of the invention and are within the scope of the description and the accompanying Figures. For example, but without limitation, structural or functional elements might be rearranged consistent with the present invention. Similarly, principles according to the present invention could be applied to other examples, which, even if not specifically described here in detail, would nevertheless be within the scope of the present invention.

What is claimed is:

1. A memory system comprising:
   a memory configured to have stored data periodically rewritten by a refresh command, the memory having an input/output ("I/O") terminal;
   a memory controller configured to be communicatively coupled by a channel to the I/O terminal and further configured to:
      tally a plurality of commands transmitted over the channel to the memory during a sampling period,
      estimate a total energy consumed based on the tally of the plurality of commands during the sampling period;
      determine a refresh cycle rate based on the estimated total energy consumed; and
      transmit a refresh command to the memory at the refresh cycle rate.

2. The memory system of claim 1, wherein the total energy consumed is estimated from the tally of the plurality of commands, an average current for each of the plurality of commands, and a time of execution for each of the plurality of commands.

3. The memory system of claim 2, wherein the memory controller maintains a table of average or peak current for each of the plurality of commands.

4. The memory system of claim 3, wherein the average or the peak current for a particular command of the plurality of commands is programmable.

5. The memory system of claim 1, wherein the estimation of the total energy consumed includes a component based on a heat dissipation characteristic of the memory.

6. The memory system of claim 5, wherein the memory controller is further configured to determine a temperature of the memory, based on the estimated total energy consumed in the sampling period.

7. The memory system of claim 6, wherein the memory controller includes a stored table of optimum refresh cycle rates for a plurality of possible temperatures of the memory, and wherein the refresh cycle rate is selected from the table based on a temperature of the memory associated with the estimated total energy consumed.

8. The memory system of claim 1, wherein the total energy consumed is estimated from a weighted average energy consumption associated with each command of the plurality of commands.

9. The memory system of claim 8, wherein the refresh cycle rate is calculated from the estimated total energy consumed based on the weighted average energy consumption associated with each command of the plurality of commands and a previously recorded rate.

10. The memory system of claim 1, wherein the memory controller is further configured to tally the plurality of commands executed in the memory during the sampling period.

11. The memory system of claim 1, wherein the refresh command is transmitted once per a predetermined time period, wherein the time period is determined from the refresh cycle rate.

12. The memory system of claim 1, wherein the memory controller is configured to estimate the total energy consumed on a per-rank basis.

13. A method of determining a refresh rate for a memory device using an estimation of temperature, the method comprising:

storing, at a memory controller, a tally of commands transmitted to a memory within a sampling period;

determining, at the memory controller, a total energy consumed associated with the transmitted commands in the tally;

determining, at the memory controller, a refresh cycle rate based on the total energy consumed; and transmitting a refresh command to a memory device associated with the memory controller at the refresh cycle rate.

14. The method of claim 13, wherein determining a total energy consumed comprises integrating an average or peak current for each of the transmitted commands in the tally and a time of execution for each of the transmitted commands.

15. The method of claim 14, wherein determining a total energy consumed further comprises subtracting a heat dissipation component.

16. The method of claim 15, the method further comprising determining a temperature of the memory based on the total energy consumed in the sampling period.

17. The method of claim 13, wherein determining a refresh cycle rate includes accessing a look-up table.

18. The method of claim 13, the method further comprising estimating the total energy consumed from a weighted average energy consumption associated with each command of the tally of commands.

19. The method of claim 13, the method further comprising calculating the refresh cycle rate from the total energy consumed based on the weighted average energy consumption associated with each command of the tally of commands in the sampling period and a previously recorded refresh cycle rate.

20. The method of claim 13, wherein recording a tally of commands comprises recording a tally of a plurality of commands executed in the memory during the sampling period.

* * * * *